(12) United States Patent
Cho

(10) Patent No.: US 10,325,867 B2
(45) Date of Patent: Jun. 18, 2019

(54) SEMICONDUCTOR DEVICE AND RADIO FREQUENCY MODULE FORMED ON HIGH RESISTIVITY SUBSTRATE

(71) Applicant: Dongbu Hitek Co., Ltd., Seoul (KR)

(72) Inventor: Yong Soo Cho, Daejeon (KR)

(73) Assignee: DB Hitek Co., Ltd, Seoul (KR)

( * ) Notice: Subject to any disclaimer, the term of this patent is extended or adjusted under 35 U.S.C. 154(b) by 223 days.

(21) Appl. No.: 15/041,561

(22) Filed: Feb. 11, 2016

(65) Prior Publication Data

US 2016/0372429 A1 Dec. 22, 2016

(30) Foreign Application Priority Data

Jun. 18, 2015 (KR) .................. 10-2015-0086371

(51) Int. Cl.
| | |
|---|---|
| *H01L 23/66* | (2006.01) |
| *H01L 27/088* | (2006.01) |
| *H01L 29/06* | (2006.01) |
| *H01L 29/08* | (2006.01) |
| *H01L 21/8234* | (2006.01) |

(Continued)

(52) U.S. Cl.
CPC ............ *H01L 23/66* (2013.01); *H01L 21/761* (2013.01); *H01L 21/823493* (2013.01); *H01L 21/84* (2013.01); *H01L 27/088* (2013.01); *H01L 27/1203* (2013.01); *H01L 29/1083* (2013.01);
(Continued)

(58) Field of Classification Search
CPC ..... H01L 21/823878; H01L 21/823481; H01L 21/823493; H01L 21/823892; H01L 29/0619; H01L 29/0642–29/4653; H01L 29/1083; H01L 29/1087; H01L 29/0692; H01L 29/0684
See application file for complete search history.

(56) References Cited

U.S. PATENT DOCUMENTS 6,011,297 A * 1/2000 Rynne ................ H01L 29/0649
257/508
6,288,429 B1 9/2001 Iwata et al.
(Continued)

FOREIGN PATENT DOCUMENTS

| JP | 5432751 B2 | 3/2014 |
|---|---|---|
| KR | 100250488 B1 | 4/2000 |

(Continued)

OTHER PUBLICATIONS

Korean Office Action, for Application No. KR 10-2015-0086364, dated Mar. 13, 2016, 7 pages.
(Continued)

*Primary Examiner* — David C Spalla
(74) *Attorney, Agent, or Firm* — Patterson Thuente Pedersen, P.A.

(57) ABSTRACT

A semiconductor device includes a high resistivity substrate, a transistor formed on the high resistivity substrate, and a deep trench device isolation region formed in the high resistivity substrate to surround the transistor. Particularly, the high resistivity substrate has a first conductive type, and a deep well region having a second conductive type is formed in the high resistivity substrate. Further, a low concentration well region having the first conductive type is formed on the deep well region, and the transistor is formed on the low concentration well region.

12 Claims, 8 Drawing Sheets

(51) Int. Cl.
   *H01L 29/10*     (2006.01)
   *H01L 21/84*     (2006.01)
   *H01L 21/761*    (2006.01)
   *H01L 27/12*     (2006.01)
   *H01L 29/78*     (2006.01)

(52) U.S. Cl.
   CPC ...... *H01L 29/1087* (2013.01); *H01L 29/0692* (2013.01); *H01L 29/78* (2013.01)

(56) References Cited

U.S. PATENT DOCUMENTS

| | | | |
|---|---|---|---|
| 6,509,615 B2* | 1/2003 | Iwata | H01L 21/76229 257/368 |
| 6,956,266 B1 | 10/2005 | Voldman et al. | |
| 7,217,609 B2 | 5/2007 | Norstrom et al. | |
| 7,999,320 B2 | 8/2011 | Botula et al. | |
| 8,089,129 B2 | 1/2012 | Disney et al. | |
| 8,659,116 B2* | 2/2014 | Disney | H01L 29/7811 257/499 |
| 8,861,214 B1 | 10/2014 | Wu et al. | |
| 2007/0164809 A1 | 7/2007 | Fukuda et al. | |
| 2008/0173949 A1* | 7/2008 | Ma | H01L 21/823878 257/371 |
| 2008/0203444 A1 | 8/2008 | Kim et al. | |
| 2009/0020811 A1 | 1/2009 | Voldman | |
| 2011/0062547 A1* | 3/2011 | Onishi | H01L 21/764 257/510 |
| 2011/0186907 A1 | 8/2011 | Jujii | |
| 2013/0265086 A1* | 10/2013 | Chang | H01L 29/0657 327/109 |
| 2014/0226759 A1 | 8/2014 | Han et al. | |

FOREIGN PATENT DOCUMENTS

| | | |
|---|---|---|
| KR | 20000057396 A | 9/2000 |
| KR | 20060124655 A | 12/2006 |
| KR | 100873892 B1 | 12/2008 |
| KR | 20120003910 A | 1/2012 |
| KR | 20130113750 A | 10/2013 |
| KR | 20140101215 A | 8/2014 |
| KR | 20150034212 A | 4/2015 |
| TW | 559857 B | 11/2003 |
| TW | 200945557 A | 11/2009 |
| WO | WO2014/004535 A1 | 1/2014 |

OTHER PUBLICATIONS

Korean Office Action, for Application No. KR 10-2015-0086369, dated Mar. 13, 2016, 7 pages.
Korean Office Action, for Application No. KR 10-2015-0086371, dated Jul. 19, 2016, 7 pages.
Taiwanese Office Action, for Application No. TW 105116805, dated Dec. 8, 2016, 8 pages.
Application and File history for U.S. Appl. No. 15/041,576, filed Feb. 11, 2016. Inventor Yong Soo Cho.
Application and File history for U.S. Appl. No. 15/041,535, filed Feb. 11, 2016. Inventor Yong Soo Cho.
Application and File history for U.S. Appl. No. 15/041,594, filed Feb. 11, 2016. Inventor Yong Soo Cho.

* cited by examiner

SEMICONDUCTOR DEVICE AND RADIO FREQUENCY MODULE FORMED ON HIGH RESISTIVITY SUBSTRATE

CROSS-REFERENCE TO RELATED APPLICATION

This application claims priority to Korean Patent Application No. 10-2015-0086371, filed on Jun. 18, 2015 and all the benefits accruing therefrom under 35 U.S.C. § 119, the contents of which are incorporated by reference in their entirety.

TECHNICAL FIELD

The present disclosure relates to a semiconductor device and a radio frequency (RF) module formed on a high resistivity substrate, and more particularly, to a semiconductor device formed on a high resistivity silicon substrate and an RF module including the same.

BACKGROUND

An RF module such as an RF front-end module (FEM) may be incorporated into various types of wireless devices, including mobile phones, smart phones, notebooks, tablet PCs, PDAs, electronic gaming devices, multi-media systems, and the like. The RF module may include an RF active device, an RF passive device, an RF switching device and a control device.

The RF switching device may be generally manufactured on a SOI (silicon on insulator) substrate to reduce RF noise coupling, and the RF module may have a SIP/MCM (single in-line package/multi-chip module) structure including the RF switching device, the RF active device, the RF passive device and the control device.

However, there is a limit in reducing the manufacturing cost of the RF FEM due to the relatively high price of the SOI substrate and the cost of the SIP/MCM process.

SUMMARY

The present disclosure describes a semiconductor device formed on a high resistivity substrate and an RF module including the same.

In accordance with an aspect of the claimed invention, a semiconductor device may include a high resistivity substrate having a first conductive type, a deep well region having a second conductive type and formed in the high resistivity substrate, a low concentration well region having the first conductive type and formed on the deep well region, a transistor formed on the low concentration well region, and a deep trench device isolation region formed in the high resistivity substrate to surround the transistor.

In accordance with some exemplary embodiments, the semiconductor device may further include a shallow trench device isolation region formed on the deep trench device isolation region.

In accordance with some exemplary embodiments, the transistor may include a gate structure formed on the low concentration well region, source and drain regions formed at surface portions of the low concentration well region adjacent to both sides of the gate structure, respectively, and a high concentration impurity region formed on one side of the source region.

In accordance with some exemplary embodiments, the source region may have the second conductive type, the high concentration impurity region may have the first conductive type, and the source region and the high concentration impurity region may be electrically connected with each other.

In accordance with some exemplary embodiments, the low concentration well region may have an impurity concentration in a range of about 1E+10 to about 1E+12 ions/cm$^2$.

In accordance with some exemplary embodiments, the deep well region and the low concentration well region may be formed inside the deep trench device isolation region, and the deep trench device isolation region may be formed deeper than the deep well region.

In accordance with some exemplary embodiments, a second well region having the first conductive type may be formed outside the deep trench device isolation region, and a second high concentration impurity region having the first conductive type may be formed on the second well region.

In accordance with some exemplary embodiments, the deep well region may be formed wider than the low concentration well region, and the deep trench device isolation region may be formed deeper than the deep well region to pass through the deep well region.

In accordance with some exemplary embodiments, a second well region having the second conductive type may be formed outside the deep trench device isolation region, and a second high concentration impurity region having the second conductive type may be formed on the second well region.

In accordance with some exemplary embodiments, the deep trench device isolation region may have a slit to electrically connect the deep well region with the second well region.

In accordance with some exemplary embodiments, a third well region having the first conductive type may be formed outside the second well region.

In accordance with some exemplary embodiments, the semiconductor device may further include a second device isolation region formed to surround the second well region and the second high concentration impurity region. The second device isolation region may include a second deep trench device isolation region and a second shallow trench device isolation region formed on the second deep trench device isolation region.

In accordance with some exemplary embodiments, a third well region having the first conductive type may be formed outside the second device isolation region.

In accordance with some exemplary embodiments, a surface portion of the high resistivity substrate may be used as the low concentration well region.

In accordance with another aspect of the claimed invention, a semiconductor device may include a high resistivity substrate having a first conductive type, a deep well region having a second conductive type and formed in the high resistivity substrate, a low concentration well region having the first conductive type and formed on the deep well region, a plurality of transistors formed on the low concentration well region and disposed in a multi-finger structure in which the plurality of transistors is electrically connected with one another, and a deep trench device isolation region having a ring shape to surround the plurality of transistors and formed deeper than the deep well region.

In accordance with some exemplary embodiments, the low concentration well region may have an impurity concentration in a range of about 1E+10 to about 1E+12 ions/cm$^2$.

In accordance with some exemplary embodiments, a high concentration impurity region having the first conductive type may be formed between source regions of transistors disposed adjacent with each other among the plurality of transistors, and the high concentration impurity region and the source regions of the adjacent transistors may be electrically connected with one another.

In accordance with some exemplary embodiments, a second well region having the second conductive type may be formed outside the deep trench device isolation region, a second high concentration impurity region having the second conductive type may be formed on the second well region, and the deep trench device isolation region may have a slit to electrically connect the deep well region with the second well region.

In accordance with some exemplary embodiments, a second deep trench device isolation region may be formed outside the second well region, a third well region having the first conductive type may be formed outside the second deep trench device isolation region, and a third high concentration impurity region having the first conductive type may be formed on the third well region.

In accordance with still another aspect of the claimed invention, a radio frequency (RF) module may include an RF switching device formed on a high resistivity substrate, an RF active device formed on the high resistivity substrate, an RF passive device formed on the high resistivity substrate, and a control device formed on the high resistivity substrate. Particularly, the RF switching device may include a deep well region having a second conductive type and formed in the high resistivity substrate, a low concentration well region having a first conductive type and formed on the deep well region, a transistor formed on the low concentration well region, and a deep trench device isolation region formed in the high resistivity substrate to surround the transistor.

The above summary of the invention is not intended to describe each illustrated embodiment or every implementation of the present invention. The detailed description and claims that follow more particularly exemplify these embodiments.

BRIEF DESCRIPTION OF THE DRAWINGS

Exemplary embodiments can be understood in more detail from the following description taken in conjunction with the accompanying drawings, in which.

Figure 1:
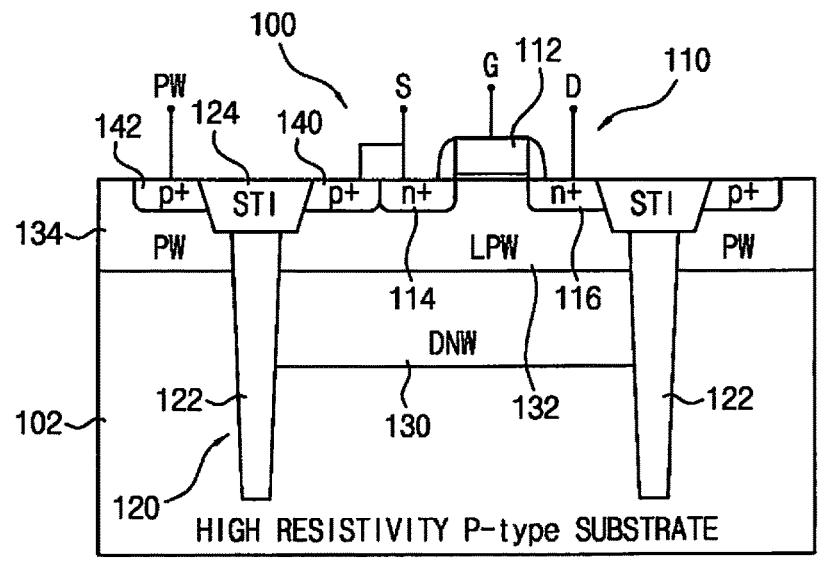
FIG. 1 is a cross-sectional view illustrating a semiconductor device in accordance with a first exemplary embodiment of the claimed invention.

While embodiments are amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF EMBODIMENTS

Hereinafter, specific embodiments will be described in more detail with reference to the accompanying drawings. The claimed invention may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, films, regions or plates may also be present. Unlike this, it will also be understood that when a layer, a film, a region or a plate is referred to as being 'directly on' another one, it is directly on the other one, and one or more intervening layers, films, regions or plates do not exist. Also, though terms like a first, a second, and a third are used to describe various components, compositions, regions and layers in various embodiments of the claimed invention are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the claimed invention. Unless otherwise defined herein, all the terms used herein, which include technical or scientific terms, may have the same meaning that is generally understood by those skilled in the art.

The depicted embodiments are described with reference to schematic diagrams of some embodiments of the claimed invention. Accordingly, changes in the shapes of the diagrams, for example, changes in manufacturing techniques and/or allowable errors, are expected. Embodiments of the claimed invention are not described as being limited to specific shapes of areas described with diagrams and include deviations in the shapes. The areas described with drawings likewise are entirely schematic and their shapes do not represent exact shapes, but rather the claimed invention is intended to include components of various other sizes, shapes, and details that would be understood to those of ordinary skill in the art.

FIG. 1 is a cross-sectional view illustrating a semiconductor device in accordance with a first exemplary embodiment of the claimed invention.

Referring to FIG. 1, a semiconductor device 100, in accordance with a first exemplary embodiment of the claimed invention, may be used to manufacture an RF module such as an RF FEM. The RF FEM may be incorporated into various types of wireless devices, including mobile phones, smart phones, notebooks, tablet PCs, PDAs, electronic gaming devices, multi-media systems, and the like. The semiconductor device 100 may be used as an RF switching device of the RF FEM.

The semiconductor device 100 may include a transistor 110 such as a field effect transistor (FET) formed on a high resistivity substrate 102. The high resistivity substrate 102 may be formed of silicon (Si) and have a first conductive type, for example, P-type.

For example, the high resistivity substrate 102 may be lightly doped with a P-type impurity, for example, boron, indium, or combinations thereof and may have a relatively high resistivity higher than about 100 ohm·cm. Particularly, the high resistivity substrate 102 may have a high resistivity of about 1,000 ohm·cm to about 20,000 ohm·cm.

As shown in FIG. 1, though one transistor 110 is formed on the high resistivity substrate 102, a plurality of transistors may be formed on an active region of the high resistivity substrate 102.

In accordance with the first exemplary embodiment, the semiconductor device 100 may include a device isolation region 120 configured to surround the transistor 110. Particularly, the device isolation region 120 may have a ring shape to, in combination with high resistivity substrate 102, electrically surround the transistor 110. Device isolation region 120 may include a deep trench device isolation (DTI) region 122 and a shallow trench device isolation (STI) region 124. The STI region 124 may be formed on the DTI region 122, in embodiments.

A depth of the DTI region 122 may be greater than about 5 μm. Particularly, a depth of the DTI region 122 may be in a range of about 5 μm to about 10 μm. The DTI region 122 may used to reduce an RF noise coupling and improve electrical characteristics of an RF passive device adjacent to the semiconductor device 100.

To form the DTI region 122, a deep trench may be formed by a deep reactive ion etching (DRIE) process and an oxide liner (not shown) may be formed on inner surfaces of the deep trench by a thermal oxidation process. Then, the deep trench may be filled up with un-doped poly-silicon thereby forming the DTI region 122. Meanwhile, a shallow trench may be formed at a surface portion of the high resistivity substrate 102 and may then be filled up with silicon oxide thereby forming the STI region 124.

The transistor 110 may include a gate structure 112 formed on the high resistivity substrate 102 and source and drain regions 114 and 116 formed at surface portions of the high resistivity substrate 102 adjacent to both sides of the gate structure 112, respectively. The source and drain regions 114 and 116 may be doped with an impurity having a second conductive type. For example, the source and drain regions 114 and 116 may be doped with an N-type impurity such as phosphorus, arsenic, or combinations thereof. The gate structure 112 may include a gate insulating layer formed on the high resistivity substrate 102, a gate electrode formed on the gate insulating layer and a spacer formed on side surfaces of the gate electrode.

A low concentration well region 132 having the first conductive type, i.e., P-type, may be formed under the transistor 110, and a deep well region having the second conductive type, i.e., N-type, 130 may be formed under the low concentration well region 132. For example, a deep N-type well (DNW) region 130 may be formed in the high resistivity substrate 102, and a low concentration P-type well (LPW) region 132 may be formed on the DNW region 130. The transistor 110 may be formed on the LPW region 132.

The DNW region 130 and the LPW region 132 may be formed inside the DTI region 122. The DTI region 122 may extend deeper (that is, further away from transistor 110) than the DNW region 130, in embodiments. Thus, the RF noise coupling of the semiconductor device 100 may be significantly reduced, and the electrical characteristics of the RF passive device adjacent to the semiconductor device 100 may be significantly improved by the DTI region 122. Further, a junction capacitance between the DNW region 130 and the high resistivity substrate 102 may be significantly reduced.

Particularly, the LPW region 132 may be used to reduce off-state capacitance (Coff) and on-state resistance (Ron) of the semiconductor device 100. In detail, depletion regions between the source and drain regions 114 and 116 and the LPW region 132 may sufficiently extend such that the Coff and Ron of the semiconductor device 100 are significantly reduced. As a result, the RF switch performance of the semiconductor device 100 may be sufficiently improved.

For example, the LPW region 132 may have an impurity concentration in a range of about 1E+10 to about 1E+12 ions/cm$^2$. Alternatively, though not shown in figures, a first P-type well (PW) region may be formed between the DNW region 130 and the LPW region 132 in other embodiments. In such case, it is desirable that the LPW region 132 may have an impurity concentration lower than that of the first PW region to facilitate proper current flow.

Further, the LPW region 132 may be an un-implanted region. That is, a surface portion of the high resistivity substrate 102 may be used as the LPW region 132.

In accordance with the first exemplary embodiment, a high concentration impurity region 140 having the first conductive type, i.e., P-type, may be formed on one side of the source region 114, which may be used as a substrate tab or a well tab. The high concentration impurity region 140 may be electrically connected with the source region 114. The high concentration impurity region 140 may be used to improve a source contact and reduce a voltage drop of the semiconductor device 100.

Meanwhile, a second well region having the first conductive type, for example, a second P-type well (PW) region 134, may be formed outside the device isolation region 120, and a second high concentration impurity region 142 having the first conductive type, i.e., P-type, may be formed on the second PW region 134. The second high concentration impurity region 142 may be used to apply a PW bias voltage to the high resistivity substrate 102.

Figure 2:
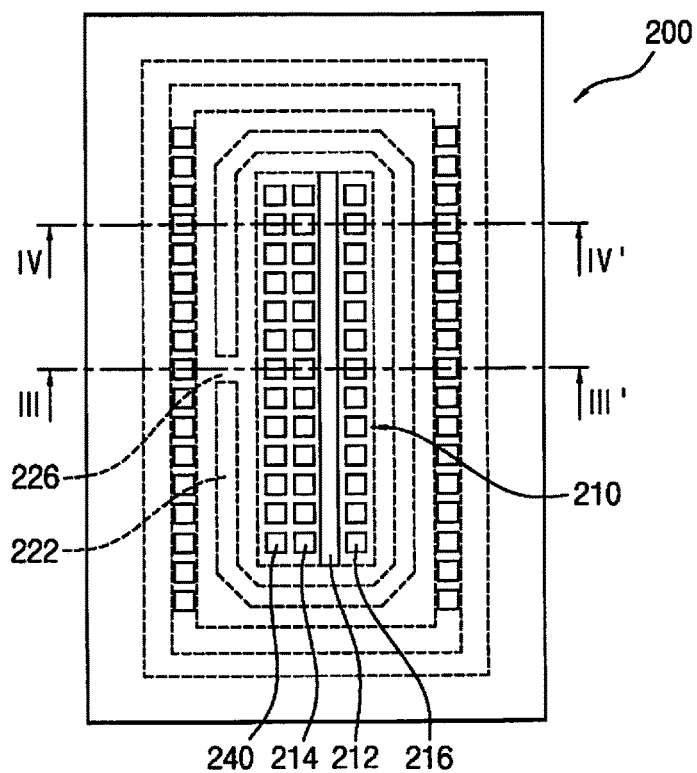
FIG. 2 is a plan view illustrating a semiconductor device in accordance with a second exemplary embodiment of the claimed invention.
Figure 3:
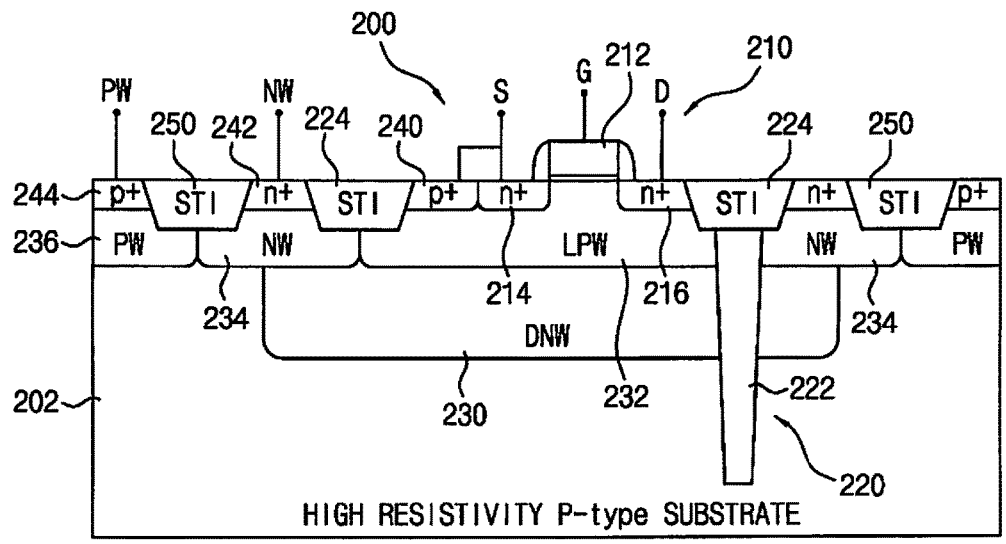
FIG. 3 is a cross-sectional view taken along line III-III' as shown in FIG. 2.
Figure 4:
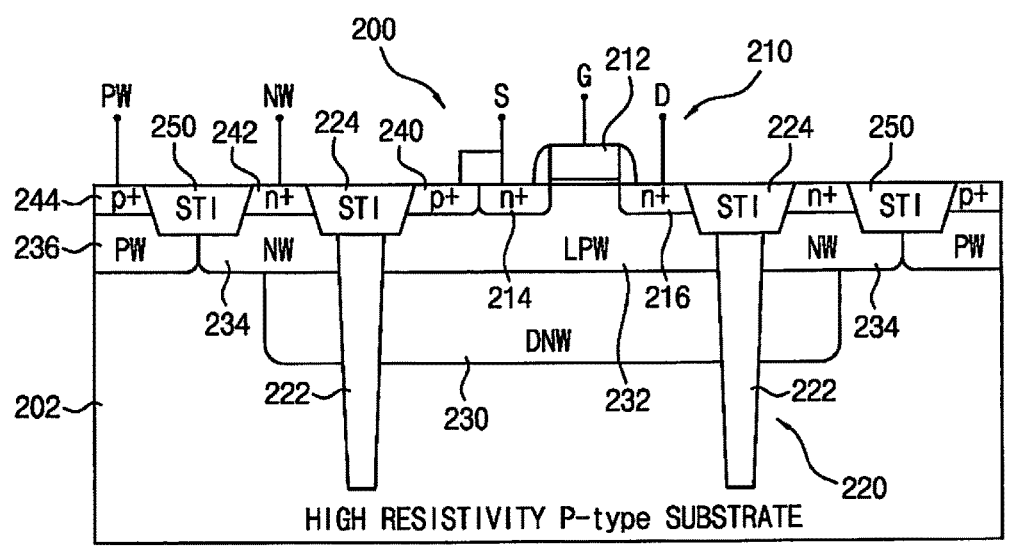
FIG. 4 is a cross-sectional view taken along line IV-IV' as shown in FIG. 2.

FIG. 2 is a plan view illustrating a semiconductor device in accordance with a second exemplary embodiment of the claimed invention, FIG. 3 is a cross-sectional view taken along line III-III' as shown in FIG. 2, and FIG. 4 is a cross-sectional view taken along line IV-IV' as shown in FIG. 2.

Referring to FIGS. 2 to 4, a semiconductor device 200, in accordance with a second exemplary embodiment of the claimed invention, may include a plurality of transistors 210 formed on a high resistivity substrate 202. A DNW region 230 may be formed in the high resistivity substrate 202, and an LPW region 232 may be formed on the DNW region 230.

The transistors 210 may be formed on the LPW region 232. Each of the transistors 210 may include a gate structure 212 formed on the LPW region 232 and source and drain regions 214 and 216 formed at surface portions of the LPW region 232 adjacent to both sides of the gate structure 212, respectively, and a P-type high concentration impurity region 240 may be formed on one side of the source region 214. The gate structure 212 may include a gate insulating layer formed on the LPW region 232, a gate electrode formed on the gate insulating layer and a spacer formed on side surfaces of the gate electrode.

In accordance with the second exemplary embodiment, the semiconductor device 200 may include a device isolation region 220 configured to surround an active region on which the transistors 210 are formed. The device isolation region 220 may include a DTI region 222 formed deeper than the DNW region 230 and a STI region 224 formed on the DTI region 222.

An N-type well (NW) region 234 may be formed outside the device isolation region 220, and an N-type high concentration impurity region 242 may be formed on the NW region 234.

Particularly, the LPW region 232 may be formed inside the device isolation region 220, and the DNW region 230 may be formed wider than the LPW region 232. The DTI region 222 may pass through the DNW region 230 and extend deeper than the DNW region 230 (i.e., extend further from the surface having transistor 210 as shown in FIG. 4). The NW region 234 may be formed on an edge portion of the DNW region 230 (i.e., closer to the surface holding transistor 210, and also arranged to extend further along the plane parallel that same surface).

In accordance with the second exemplary embodiment, the NW region 234 may be electrically connected with the edge portion of the DNW region 230, and the DTI region 222 may have a slit 226 to electrically connect the DNW region 230 with the NW region 234. The slit 226 may be used to apply an NW bias voltage or a reverse bias voltage to the DNW region 230 through the N-type high concentration impurity region 242 and the NW region 234. For example, a width of the slit 226 may be in a range of about 1 µm to about 2 µm.

Thus, a depletion region between the LPW region 232 and the DNW region 230 and a depletion region between the DNW region 230 and the high resistivity substrate 202 may extend, and a junction capacitance between the LPW region 232 and the DNW region 230 and a junction capacitance between the DNW region 230 and the high resistivity substrate 202 may be significantly reduced. As a result, an RF noise coupling of the semiconductor device 200 and a leakage current through the high resistivity substrate 202 may be significantly reduced.

Particularly, depletion regions between the source and drain regions 214 and 216 and the LPW region 232 may sufficiently extend such that the Coff and Ron of the semiconductor device 200 may be significantly reduced. As a result, the RF switch performance of the semiconductor device 200 may be significantly improved.

For example, the LPW region 232 may have an impurity concentration in a range of about 1E+10 to about 1E+12 ions/cm². Alternatively, though not shown in figures, a first P-type well (PW) region may be formed between the DNW region 230 and the LPW region 232. In such case, it is desirable that the LPW region 232 may have an impurity concentration lower than that of the first PW region.

Further, the LPW region 232 may be an un-implanted region. That is, a surface portion of the high resistivity substrate 202 may be used as the LPW region 232.

Meanwhile, a second PW region 236 may be formed outside the NW region 234, and a second P-type high concentration impurity region 244 may be formed on the second PW region 236. The second P-type high concentration impurity region 244 may be used to apply a PW bias voltage to the high resistivity substrate 202, and the second PW region 236 may be used to reduce or prevent a depletion region from extending between the NW region 234 and the high resistivity substrate 202. Further, a second STI region 250 may be formed between the N-type high concentration impurity region 242 and the second P-type high concentration impurity region 244.

Figure 5:
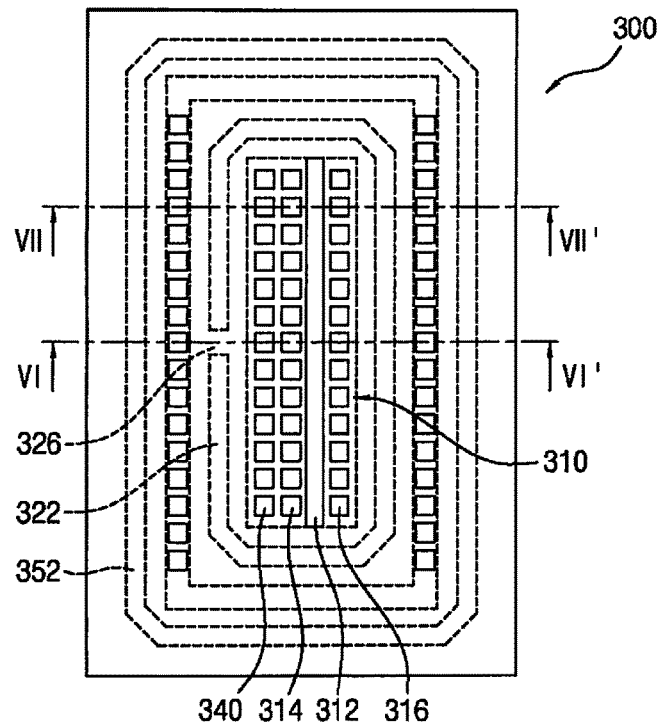
FIG. 5 is a plan view illustrating a semiconductor device in accordance with a third exemplary embodiment of the claimed invention.
Figure 6:
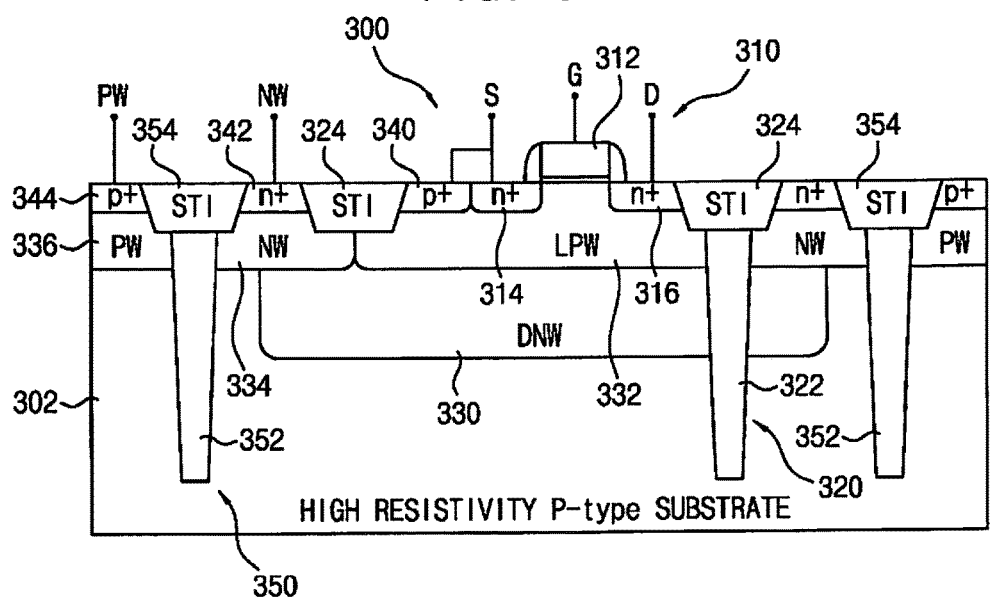
FIG. 6 is a cross-sectional view taken along line VI-VI' as shown in FIG. 5.
Figure 7:
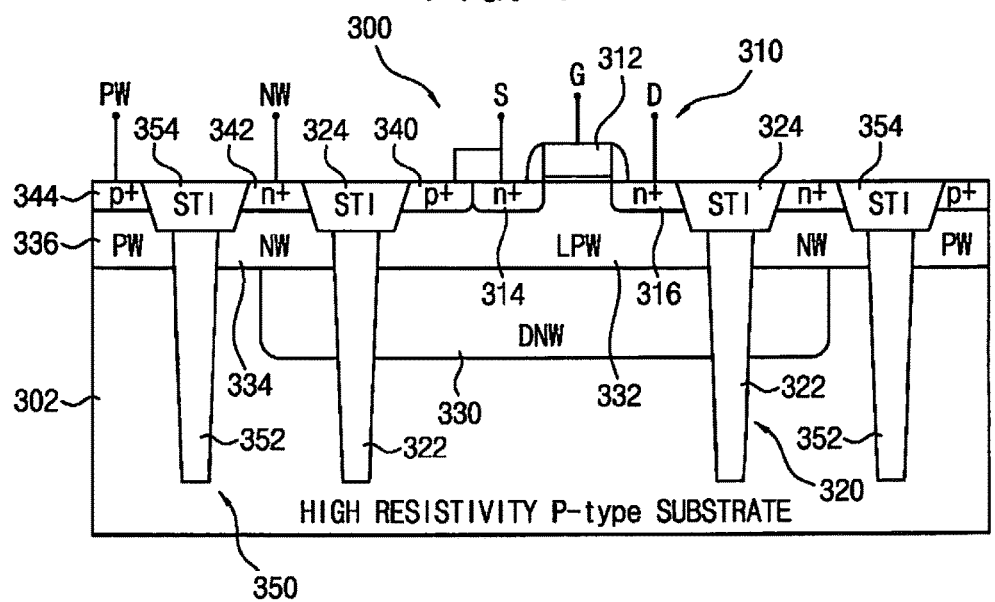
FIG. 7 is a cross-sectional view taken along line VII-VII' as shown in FIG. 5.

FIG. 5 is a plan view illustrating a semiconductor device in accordance with a third exemplary embodiment of the claimed invention, FIG. 6 is a cross-sectional view taken along line VI-VI' as shown in FIG. 5, and FIG. 7 is a cross-sectional view taken along line VII-VII' as shown in FIG. 5.

Referring to FIGS. 5 to 7, a semiconductor device 300, in accordance with a third exemplary embodiment of the claimed invention, may include a plurality of transistors 310 formed on a high resistivity substrate 302. A DNW region 330 may be formed in the high resistivity substrate 302, and an LPW region 332 may be formed on the DNW region 330.

The transistors 310 may be formed on the LPW region 332. Each of the transistors 310 may include a gate structure 312 formed on the LPW region 332 and source and drain regions 314 and 316 formed at surface portions of the LPW region 332 adjacent to both sides of the gate structure 312, respectively, and a P-type high concentration impurity region 340 may be formed on one side of the source region 314. The gate structure 312 may include a gate insulating layer formed on the LPW region 332, a gate electrode formed on the gate insulating layer and a spacer formed on side surfaces of the gate electrode.

In accordance with the third exemplary embodiment, the semiconductor device 300 may include a first device isolation region 320 configured to surround an active region on which the transistors 310 are formed. The first device isolation region 320 may include a first DTI region 322 formed deeper than (i.e., extending further away from the surface upon which transistors 310 are arranged) the DNW region 330 and a first STI region 324 formed on the first DTI region 322.

An NW region 334 may be formed outside the first device isolation region 320, and an N-type high concentration impurity region 342 may be formed on the NW region 334.

The LPW region 332 may be formed inside the first device isolation region 320, and the DNW region 330 may be formed wider than the LPW region 332 (i.e., DNW region 330 extends further along a plane parallel the surface upon which transistors 310 are built than does LPW region 332). The first DTI region 322 may pass through the DNW region 330 and extend deeper than the DNW region 330. The NW region 334 may be formed on an edge portion of the DNW region 330 to have a ring shape.

In accordance with the third exemplary embodiment, the NW region 334 may be electrically connected with the edge portion of the DNW region 330, and the first DTI region 322 may have a slit 326 to electrically connect the DNW region 330 with the NW region 334. The slit 326 may be used to apply an NW bias voltage or a reverse bias voltage to the DNW region 330 through the N-type high concentration impurity region 342 and the NW region 334. For example, a width of the slit 326 may be in a range of about 1 µm to about 2 µm.

Particularly, a second device isolation region 350 may be formed outside the NW region 334, which may have a ring shape to surround the NW region 334 and the N-type high concentration impurity region 342. The second device isolation region 350 may include a second DTI region 352 and a second STI region 354 formed on the second DTI region 352. For example, a depth of the second DTI region 352 may be greater than about 5 µm. Particularly, a depth of the second DTI region 352 may be in a range of about 5 µm to about 10 µm.

The second device isolation region 350 may be used to reduce or prevent a depletion region from extending between the DNW region 330, the NW region 334 and the high resistivity substrate 302. Further, the second device isolation region 350 may be used to electrically isolate the semiconductor device 300 from a control device adjacent thereto.

Meanwhile, a second PW region 336 may be formed outside the second device isolation region 350, and a second P-type high concentration impurity region 344 may be formed on the second PW region 336. The second P-type high concentration impurity region 344 may be used to apply a PW bias voltage to the high resistivity substrate 302.

Figure 8:
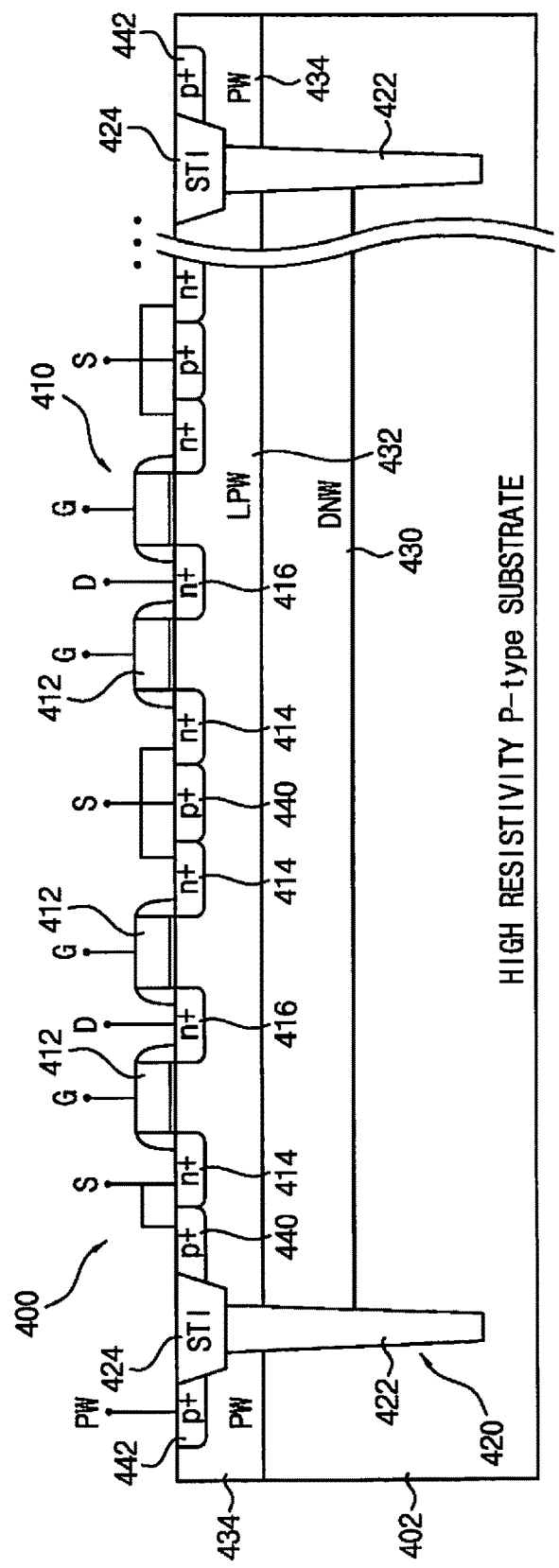
FIG. 8 is a cross-sectional view illustrating a semiconductor device in accordance with a fourth exemplary embodiment of the claimed invention.

FIG. 8 is a cross-sectional view illustrating a semiconductor device in accordance with a fourth exemplary embodiment of the claimed invention.

Referring to FIG. 8, a semiconductor device 400, in accordance with a fourth exemplary embodiment, may include a plurality of transistors 410 formed on a high resistivity substrate 402. Particularly, the semiconductor device 400 may have a multi-finger structure in which the transistors 410 are electrically connected with one another.

A DNW region 430 may be formed in the high resistivity substrate 402, and an LPW region 432 may be formed on the DNW region 430. The transistors 410 may be formed on the LPW region 432. Each of the transistors 410 may include a gate structure 412 formed on the LPW region 432 and source and drain regions 414 and 416 formed at surface portions of the LPW region 432 adjacent to both sides of the gate structure 412, respectively. The gate structure 412 may include a gate insulating layer formed on the LPW region 432, a gate electrode formed on the gate insulating layer and a spacer formed on side surfaces of the gate electrode.

In accordance with the fourth exemplary embodiment, transistors 410 adjacent with each other may use the drain region 416 in common as shown in FIG. 8. Further, transistors 410 adjacent with each other may use a P-type high concentration impurity region 440 in common. Particularly, a P-type high concentration impurity region 440, which functions as a substrate tab or a well tab, may be formed between the source regions 414 of the transistors 410 adjacent with each other, and the adjacent source regions 414 and the P-type high concentration impurity region 440 may be electrically connected with one another. The P-type high concentration impurity 440 connected with the adjacent source regions 414 may be used to improve a breakdown voltage of the semiconductor device 400.

The semiconductor device 400 may include a device isolation region 420 configured to surround an active region on which the transistors 410 are formed. The device isolation region 420 may include a DTI region 422 formed deeper than the DNW region 430 and a STI region 424 formed on the DTI region 422. The DNW region 430 and the LPW region 432 may be formed inside the device isolation region 420.

Meanwhile, a second PW region 434 may be formed outside the device isolation region 420, and a second P-type high concentration impurity region 442 may be formed on the second PW region 434. The second P-type high concentration impurity region 442 may be used to apply a PW bias voltage to the high resistivity substrate 402.

Figure 9:
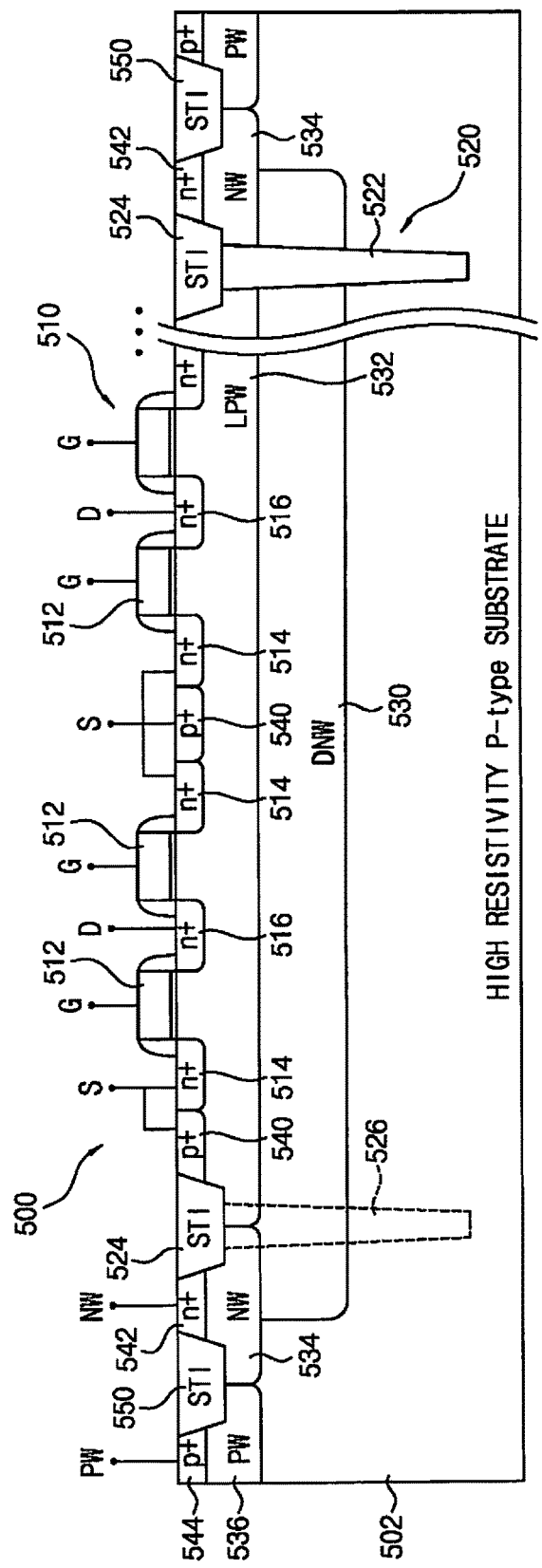
FIG. 9 is a cross-sectional view illustrating a semiconductor device in accordance with a fifth exemplary embodiment of the claimed invention.

FIG. 9 is a cross-sectional view illustrating a semiconductor device in accordance with a fifth exemplary embodiment of the claimed invention.

Referring to FIG. 9, a semiconductor device 500, in accordance with a fifth exemplary embodiment, may include a plurality of transistors 510 formed on a high resistivity substrate 502. Particularly, the semiconductor device 500 may have a multi-finger structure in which the transistors 510 are electrically connected with one another.

A DNW region 530 may be formed in the high resistivity substrate 502, and an LPW region 532 may be formed on the DNW region 530. The transistors 510 may be formed on the LPW region 532. Each of the transistors 510 may include a gate structure 512 formed on the LPW region 532 and source and drain regions 514 and 516 formed at surface portions of the LPW region 532 adjacent to both sides of the gate structure 512, respectively. The gate structure 512 may include a gate insulating layer formed on the LPW region 532, a gate electrode formed on the gate insulating layer and a spacer formed on side surfaces of the gate electrode.

In accordance with the fifth exemplary embodiment, transistors 510 adjacent with each other may use the drain region 516 in common as shown in FIG. 9. Further, transistors 510 adjacent with each other may use a P-type high concentration impurity region 540 in common. Particularly, a P-type high concentration impurity region 540, which functions as a substrate tab or a well tab, may be formed between the source regions 514 of the transistors 510 adjacent with each other, and the adjacent source regions 514 and the P-type high concentration impurity region 540 may be electrically connected with one another.

The semiconductor device 500 may include a device isolation region 520 configured to surround an active region on which the transistors 510 are formed. The device isolation region 520 may include a DTI region 522 formed deeper than the DNW region 530 and a STI region 524 formed on the DTI region 522. An NW region 534 may be formed outside the device isolation region 520, and an N-type high concentration impurity region 542 may be formed on the NW region 534.

Particularly, the LPW region 532 may be formed inside the device isolation region 520, and the DNW region 530 may be formed wider than the LPW region 532. The DTI region 522 may pass through the DNW region 530 and extend deeper than the DNW region 530. The NW region 534 may be formed on an edge portion of the DNW region 530 to have a ring shape.

In accordance with the fifth exemplary embodiment, the NW region 534 may be electrically connected with the edge portion of the DNW region 530, and the DTI region 522 may have a slit 526 to electrically connect the DNW region 530 with the NW region 534. The slit 526 may be used to apply an NW bias voltage or a reverse bias voltage to the DNW region 530 through the N-type high concentration impurity region 542 and the NW region 534. For example, a width of the slit 526 may be in a range of about 1 µm to about 2 µm.

Further, a second PW region 536 may be formed outside the NW region 534, and a second P-type high concentration impurity region 544 may be formed on the second PW region 536. The second P-type high concentration impurity region 544 may be used to apply a PW bias voltage to the high resistivity substrate 502, and the second PW region 536 may be used to reduce or prevent a depletion region from extending between the NW region 534 and the high resistivity substrate 502. Still further, a second STI region 550 may be formed between the N-type high concentration impurity region 542 and the second P-type high concentration impurity region 544.

Figure 10:
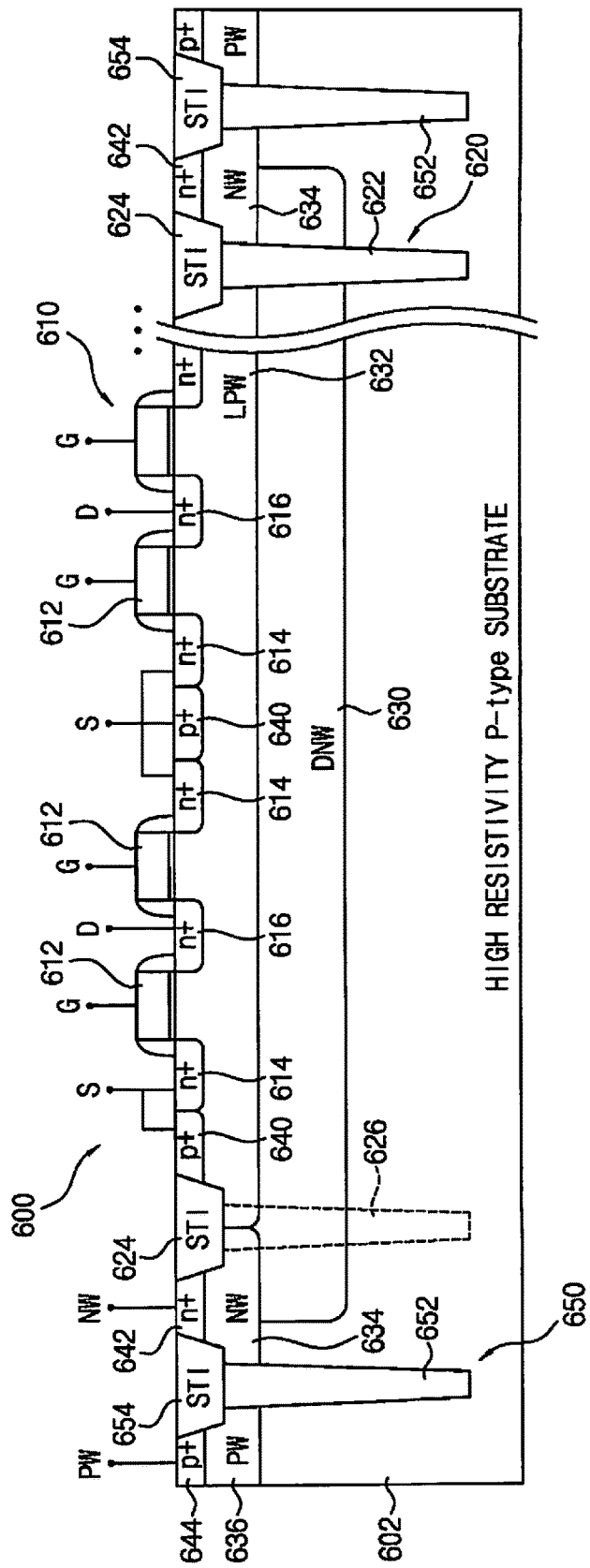
FIG. 10 is a cross-sectional view illustrating a semiconductor device in accordance with a sixth exemplary embodiment of the claimed invention.

FIG. 10 is a cross-sectional view illustrating a semiconductor device in accordance with a sixth exemplary embodiment of the claimed invention.

Referring to FIG. 10, a semiconductor device 600, in accordance with a sixth exemplary embodiment, may include a plurality of transistors 610 formed on a high resistivity substrate 602. Particularly, the semiconductor device 600 may have a multi-finger structure in which the transistors 610 are electrically connected with one another.

A DNW region 630 may be formed in the high resistivity substrate 602, and an LPW region 632 may be formed on the DNW region 630. The transistors 610 may be formed on the LPW region 632. Each of the transistors 610 may include a gate structure 612 formed on the LPW region 632 and source and drain regions 614 and 616 formed at surface portions of the LPW region 632 adjacent to both sides of the gate structure 612, respectively. The gate structure 612 may include a gate insulating layer formed on the LPW region 632, a gate electrode formed on the gate insulating layer and a spacer formed on side surfaces of the gate electrode.

In accordance with the sixth exemplary embodiment, transistors 610 adjacent with each other may use the drain region 616 in common as shown in FIG. 10. Further, transistors 610 adjacent with each other may use a P-type high concentration impurity region 640 in common. Particularly, a P-type high concentration impurity region 640, which functions as a substrate tab or a well tab, may be formed between the source regions 614 of the transistors 610 adjacent with each other, and the adjacent source regions 614 and the P-type high concentration impurity region 640 may be electrically connected with one another.

The semiconductor device 600 may include a first device isolation region 620 configured to surround an active region on which the transistors 610 are formed. The first device isolation region 620 may include a first DTI region 622 formed deeper than the DNW region 630 and a first STI region 624 formed on the first DTI region 622. An NW region 634 may be formed outside the first device isolation region 620, and an N-type high concentration impurity region 642 may be formed on the NW region 634.

Particularly, the LPW region 632 may be formed inside the first device isolation region 620, and the DNW region 630 may be formed wider than the LPW region 632. The first DTI region 622 may pass through the DNW region 630 and extend deeper than the DNW region 630. The NW region 634 may be formed on an edge portion of the DNW region 630 to have a ring shape.

In accordance with the sixth exemplary embodiment, the NW region 634 may be electrically connected with the edge portion of the DNW region 630, and the first DTI region 622 may have a slit 626 to electrically connect the DNW region 630 with the NW region 634. The slit 626 may be used to apply an NW bias voltage or a reverse bias voltage to the DNW region 630 through the N-type high concentration impurity region 642 and the NW region 634. For example, a width of the slit 626 may be in a range of about 1 μm to about 2 μm.

Particularly, a second device isolation region 650 may be formed outside the NW region 634, which may have a ring shape to surround the NW region 634 and the N-type high concentration impurity region 642. The second device isolation region 650 may include a second DTI region 652 and a second STI region 654 formed on the second DTI region 652. For example, a depth of the second DTI region 652 may be greater than about 5 μm. Particularly, a depth of the second DTI region 652 may be in a range of about 5 μm to about 10 μm.

The second device isolation region 650 may be used to reduce or prevent a depletion region from extending between the DNW region 630, the NW region 634 and the high resistivity substrate 602. Further, the second device isolation region 650 may be used to electrically isolate the semiconductor device 600 from a control device adjacent thereto.

Further, a second PW region 636 may be formed outside the second device isolation region 650, and a second P-type high concentration impurity region 644 may be formed on the second PW region 636. The second P-type high concentration impurity region 644 may be used to apply a PW bias voltage to the high resistivity substrate 602.

Meanwhile, the semiconductor devices, in accordance with some exemplary embodiments of the claimed invention as described above, may be used as an RF switching device of an RF module such as an RF FEM.

Figure 11:
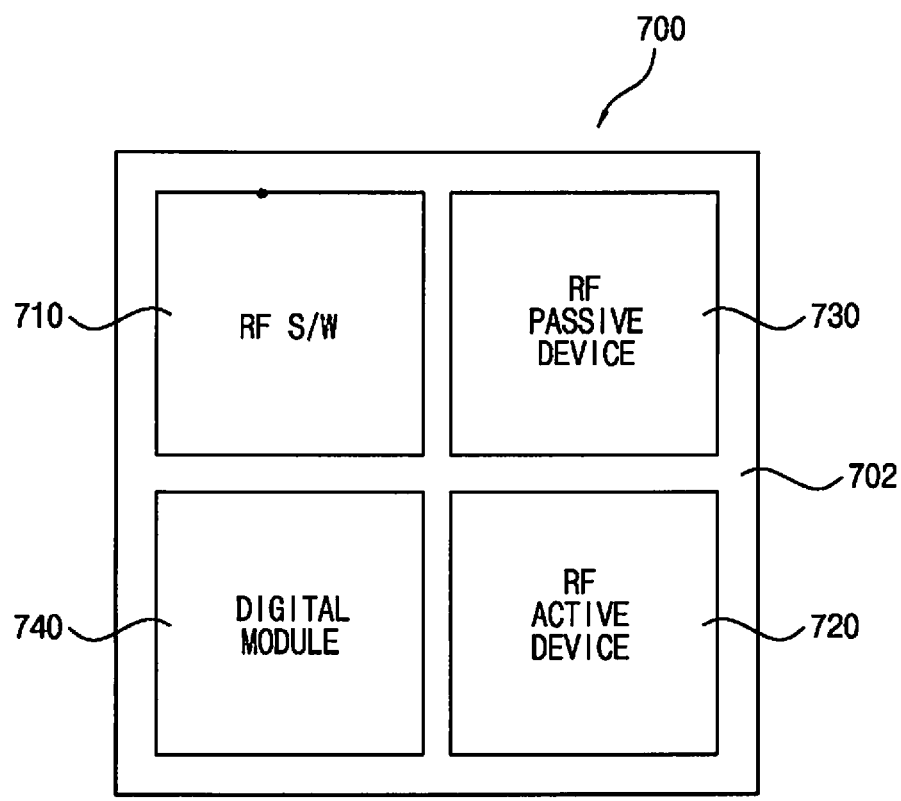
FIG. 11 is a schematic view illustrating an RF module formed on a high resistivity substrate.

FIG. 11 is a schematic view illustrating an RF module formed on a high resistivity substrate.

Referring to FIG. 11, an RF module 700, such as an RF FEM, may include an RF switching device 710, an RF active device 720, an RF passive device 730 and a control device 740, which may be formed on a high resistivity substrate 702. For example, the RF active device 720 may include a power amplifier, and the RF passive device 730 may include passive components such as capacitors, inductors, transformers, or the like.

Particularly, the heat dissipation efficiency through the high resistivity substrate 702 may be significantly improved in comparison with the conventional SOI substrate. Thus, the performance of the RF active device 720 and the electrical characteristics of the RF passive device 730 may be significantly improved.

In accordance with the exemplary embodiments of the claimed invention as described above, a semiconductor device may include a high resistivity substrate, a transistor formed on the high resistivity substrate, and a device isolation region formed in the high resistivity substrate to surround the transistor. The device isolation region may include a DTI region and a STI region formed on the DTI region. Further, the semiconductor device may include a DNW region formed in the high resistivity substrate and an LPW region formed on the DNW region, and the transistor may be formed on the LPW region.

As described above, because the semiconductor device may be manufactured by using the high resistivity substrate, the manufacturing cost of the semiconductor device may be significantly reduced in comparison with the conventional art using the SOI substrate. Further, the junction capacitance and the RF noise coupling of the semiconductor device may be significantly reduced by the DTI region and the DNW region.

Particularly, depletion regions between the source and drain regions and the LPW region may sufficiently extend, and thus the Coff and Ron of the semiconductor device may be significantly reduced. As a result, the RF switch performance of the semiconductor device may be significantly improved.

Still further, the DTI region may have a slit to apply an NW bias voltage or a reverse bias voltage to the DNW region therethrough. Thus, a junction capacitance due to the DNW region may be significantly reduced thereby significantly improving the electrical characteristics of the RF switching device.

Although the semiconductor devices have been described with reference to the specific embodiments, they are not limited thereto. Therefore, it will be readily understood by those skilled in the art that various modifications and changes can be made thereto without departing from the spirit and scope of the appended claims.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112(f) of 35 U.S.C. are not to be invoked unless the specific terms "means for" or "step for" are recited in a claim.

What is claimed is:

1. A semiconductor device comprising:
    a high resistivity substrate having a first conductive type;
    a deep well region having a second conductive type and arranged in the high resistivity substrate;
    a low concentration well region having the first conductive type and arranged on the deep well region;
    a transistor arranged on the low concentration well region;
    a device isolation region arranged in the high resistivity substrate to surround the low concentration well region and comprising a deep trench device isolation region and a shallow trench device isolation region arranged on the deep trench device isolation region;
    a second well region having the second conductive type and arranged to surround the device isolation region;
    a second device isolation region arranged to surround the second well region and comprising a second deep trench device isolation region and a second shallow trench device isolation region arranged on the second deep trench device isolation region; and
    a third well region having the first conductive type and arranged to surround the second device isolation region,
    wherein the deep well region is arranged wider than the low concentration well region, and the deep trench device isolation region extends through the deep well region so as to be deeper than the deep well region and has a slit to electrically connect the deep well region with the second well region.

2. The semiconductor device of claim 1, wherein the transistor comprises:
    a gate structure arranged on the low concentration well region;
    a source region and a drain region each arranged at surface portions of the low concentration well region, wherein the source region and the drain region are arranged at opposite sides of the gate structure; and
    a high concentration impurity region arranged on one side of the source region.

3. The semiconductor device of claim 2, wherein the source region is of the second conductive type;
    the high concentration impurity region is of the first conductive type; and
    the source region and the high concentration impurity region are electrically connected with each other.

4. The semiconductor device of claim 1, wherein the low concentration well region has an impurity concentration in a range of about 1E+10 to about 1E+12 ions/cm$^2$.

5. The semiconductor device of claim 1, wherein
    a second high concentration impurity region having the second conductive type is arranged on the second well region.

6. The semiconductor device of claim 1, wherein a surface portion of the high resistivity substrate is the low concentration well region.

7. A semiconductor device comprising:
    a high resistivity substrate having a first conductive type;
    a deep well region having a second conductive type and arranged in the high resistivity substrate;
    a low concentration well region having the first conductive type and arranged on the deep well region;
    a plurality of transistors arranged on the low concentration well region and disposed in a multi-finger structure in which the plurality of transistors is electrically connected with one another;
    a device isolation region having a ring shape to surround the low concentration well region and comprising a deep trench device isolation region and a shallow trench device isolation region arranged on the deep trench device isolation region;
    a second well region having the second conductive type and arranged to surround the device isolation region;
    a second device isolation region arranged to surround the second well region and comprising a second deep trench device isolation region and a second shallow trench device isolation region arranged on the second deep trench device isolation region; and
    a third well region having the first conductive type and arranged to surround the second device isolation region,
    wherein the deep well region is arranged wider than the low concentration well region, and the deep trench device isolation region extends through the deep well region so as to be deeper than the deep well region and has a slit to electrically connect the deep well region with the second well region.

8. The semiconductor device of claim 7, wherein the low concentration well region has an impurity concentration in a range of about 1E+10 to about 1E+12 ions/cm$^2$.

9. The semiconductor device of claim 7, wherein a high concentration impurity region having the first conductive type is arranged between source regions of transistors disposed adjacent with each other among the plurality of transistors; and the high concentration impurity region and the source regions of the adjacent transistors are electrically connected with one another.

10. The semiconductor device of claim 7, wherein a second high concentration impurity region having the second conductive type is arranged on the second well region.

11. The semiconductor device of claim 10, wherein a third high concentration impurity region having the first conductive type is arranged on the third well region.

12. A radio frequency (RF) module comprising:

an RF switching device arranged on a high resistivity substrate;

an RF active device arranged on the high resistivity substrate;

an RF passive device arranged on the high resistivity substrate; and a control device arranged on the high resistivity substrate, wherein the RF switching device comprises:

a deep well region having a second conductive type and arranged in the high resistivity substrate;

a low concentration well region having a first conductive type and arranged on the deep well region;

a transistor arranged on the low concentration well region;

a device isolation region arranged in the high resistivity substrate to surround the low concentration well region and comprising a deep trench device isolation region and a shallow trench device isolation region arranged on the deep trench device isolation region;

a second well region having the second conductive type and arranged to surround the device isolation region;

a second device isolation region arranged to surround the second well region and comprising a second deep trench device isolation region and a second shallow trench device isolation region arranged on the second deep trench device isolation region; and a third well region having the first conductive type and arranged to surround the second device isolation region, wherein the deep well region is arranged wider than the low concentration well region, and the deep trench device isolation region extends through the deep well region so as to be deeper than the deep well region and has a slit to electrically connect the deep well region with the second well region.

* * * * *